(12) United States Patent
de Souza et al.

(10) Patent No.: US 7,914,619 B2
(45) Date of Patent: Mar. 29, 2011

(54) THICK EPITAXIAL SILICON BY GRAIN REORIENTATION ANNEALING AND APPLICATIONS THEREOF

(75) Inventors: Joel P. de Souza, Putnam Valley, NY (US); Keith E. Fogel, Hopewell Junction, NY (US); Daniel A. Inns, White Plains, NY (US); Devendra K. Sadana, Pleasantville, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 12/263,889

(22) Filed: Nov. 3, 2008

(65) Prior Publication Data

US 2010/0112792 A1    May 6, 2010

(51) Int. Cl.
*C30B 29/06* (2006.01)
(52) U.S. Cl. ............... 117/84; 117/88; 117/90; 117/92; 117/94; 117/95
(58) Field of Classification Search ............ 117/84, 117/88–95
See application file for complete search history.

(56) References Cited

U.S. PATENT DOCUMENTS

| | | | | |
|---|---|---|---|---|
| 5,344,796 | A * | 9/1994 | Shin et al. ............. | 438/479 |
| 5,858,820 | A * | 1/1999 | Jung et al. ............. | 438/150 |
| 6,217,647 | B1 * | 4/2001 | Laermer et al. ........ | 117/4 |
| 6,251,715 | B1 * | 6/2001 | Jung et al. ............. | 438/161 |
| 6,936,901 | B2 * | 8/2005 | Yamamoto ............. | 257/410 |
| 6,962,861 | B2 * | 11/2005 | Luoh .................... | 438/488 |
| 7,026,219 | B2 * | 4/2006 | Pomarede et al. ..... | 438/285 |
| 7,135,388 | B2 * | 11/2006 | Ryu et al. .............. | 438/478 |
| 7,670,886 | B2 * | 3/2010 | Kakkad ................. | 438/151 |

(Continued)

FOREIGN PATENT DOCUMENTS

DE    2645374    4/1978

(Continued)

OTHER PUBLICATIONS

Mahan, A. H., et al., "Rapid thermal annealing of hot wire chemical-vapor-deposited a-Si:H films: The effect of the film hydrogen content on the crystallization kinetics, surface morphology, and grain growth", Journal of Applied Physics, 2006, pp. 023507-023507-9, vol. 99, Issue 2.

(Continued)

*Primary Examiner* — Robert M Kunemund
(74) *Attorney, Agent, or Firm* — Scully, Scott, Murphy & Presser, P.C.; Louis J. Percello, Esq.

(57) ABSTRACT

The invention provides a high temperature (about 1150° C. or greater) annealing process for converting thick polycrystalline Si layers on the order of 1 μm to 40 μm on a single crystal seed layer into thick single crystal Si layers having the orientation of the seed layer, thus allowing production of thick Si films having the quality of single crystal silicon at high rates and low cost of processing. Methods of integrating such high temperature processing into solar cell fabrication are described, with particular attention to process flows in which the seed layer is disposed on a porous silicon release layer. Another aspect pertains to the use of similar high temperature anneals for poly-Si grain growth and grain boundary passivation. A further aspect relates to structures in which these thick single crystal Si films and passivated poly-Si films are incorporated.

20 Claims, 8 Drawing Sheets

U.S. PATENT DOCUMENTS

| | | | |
|---|---|---|---|
| 2003/0013280 A1* | 1/2003 | Yamanaka | 438/487 |
| 2003/0183270 A1* | 10/2003 | Falk et al. | 136/258 |
| 2004/0135217 A1* | 7/2004 | Yamamoto | 257/410 |
| 2005/0106842 A1* | 5/2005 | Luoh | 438/488 |
| 2006/0003599 A1* | 1/2006 | Yamamoto | 438/778 |
| 2006/0252235 A1* | 11/2006 | Aberle et al. | 438/478 |
| 2008/0157095 A1* | 7/2008 | Son et al. | 257/74 |
| 2010/0112792 A1* | 5/2010 | de Souza et al. | 438/487 |

FOREIGN PATENT DOCUMENTS

EP 0405451 A1 1/1991

OTHER PUBLICATIONS

International Search Report dated Jan. 15, 2010.

Snoeckx, K. et al., "The potential of thin-film crystalline solar cells," http://www.semiconductor.net/article/CA6445466.html, 2007.

Beaucarne, G. et al., "Crystalline Si solar cells," http://www.imec.be/wwwinter/mediacenter/en/SR2003/scientific_results/research_imec/2_4_photo/2_4_2/2_4_2_1_cont.html?reload_coolmenus.

Wang, T.H. et al., "APIVT-grown silicon thin layers and PV devices," http://www.nrel.gov/docs/fy02osti/31441.pdf, May 20-24, 2002, pp. 1-5.

Saenger, K., et al., "Understanding Mask-edge and Trench-edge Defects Produced during Solid Phase Epitaxy of Amorphized Regions in (001) and (011) SI: Observations and Model," Mater. Res. Soc. Symp. Proc., 2006, vol. 995.

Saenger, K., et al., "Mixed Orientation Si-Si Interfaces by Hydrophilic Bonding and High Temperature Oxide Dissolution," Journal of The Electrochemical Society, 2007, pp. H80-H84, vol. 6.

* cited by examiner

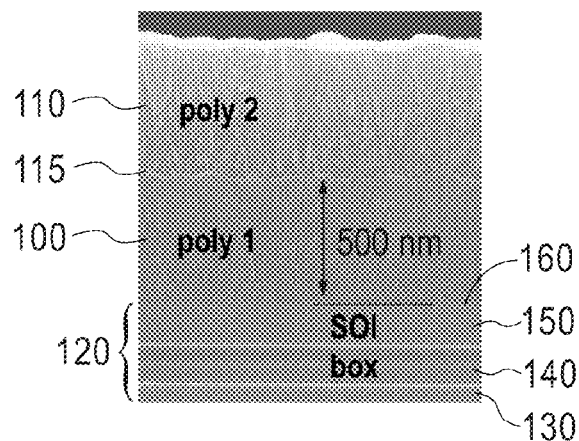
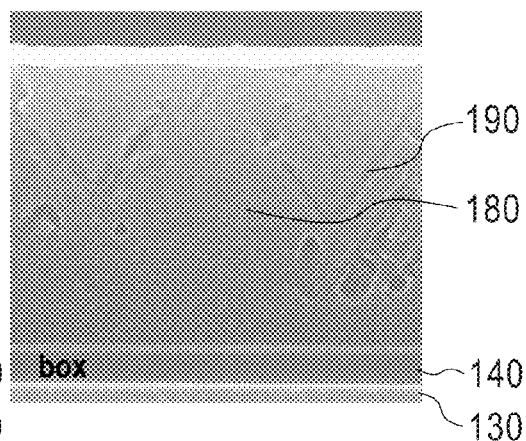
FIG. 2A  FIG. 2B
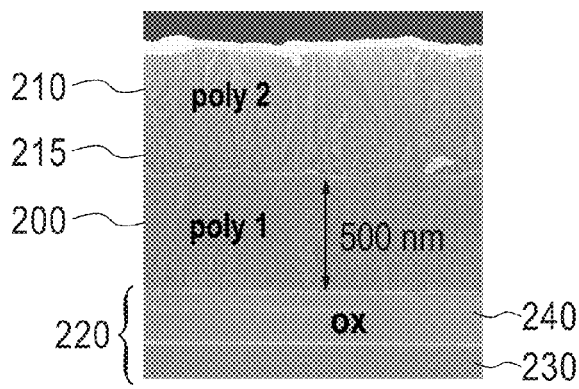
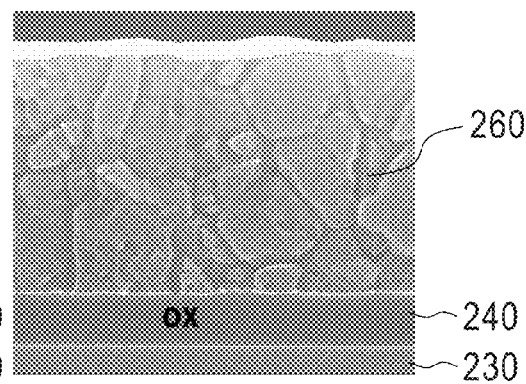
FIG. 3A  FIG. 3B

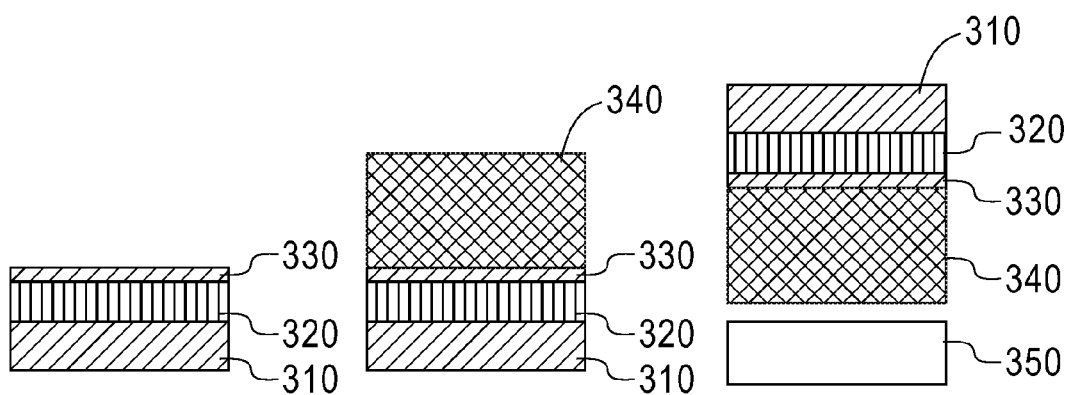
FIG. 4A   FIG. 4B   FIG. 4C
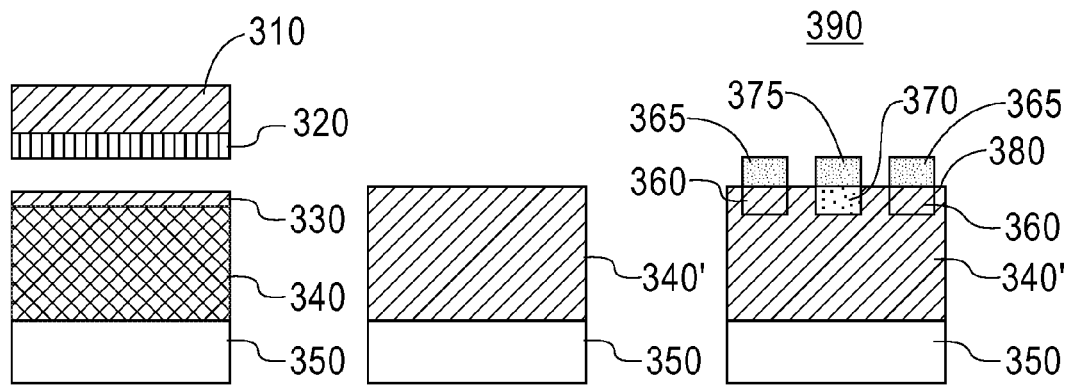
FIG. 4D   FIG. 4E   FIG. 4F

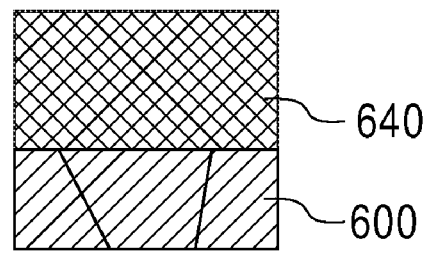
FIG. 7A        FIG. 7B
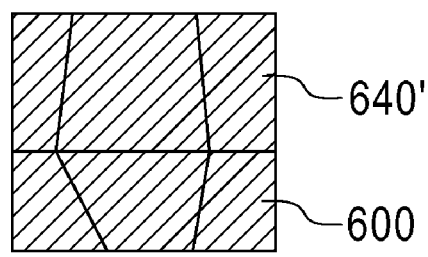
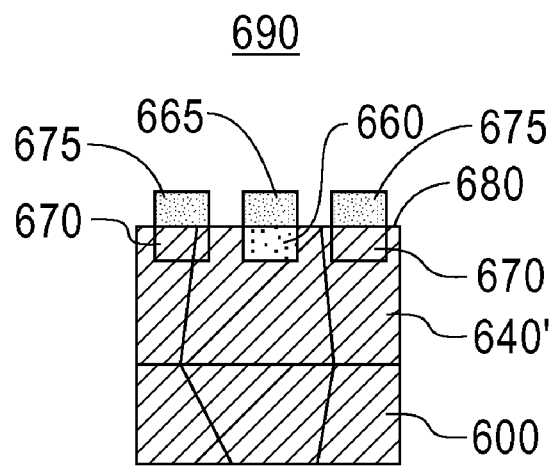
FIG. 7C        FIG. 7D

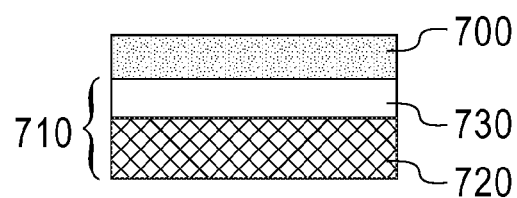
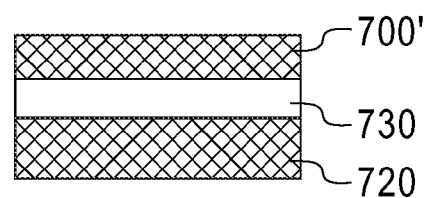
FIG. 8A  FIG. 8B
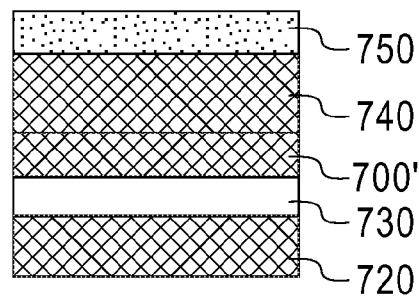
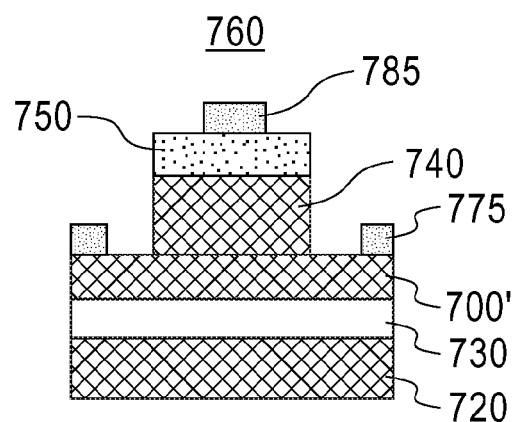
FIG. 8C  FIG. 8D

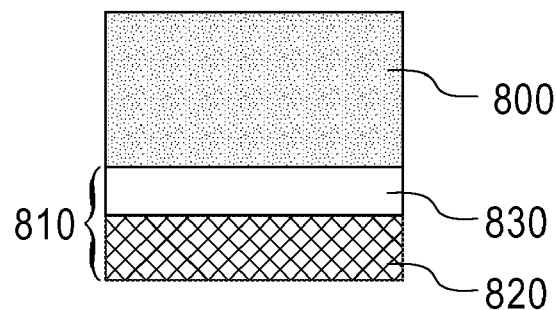
FIG. 9A
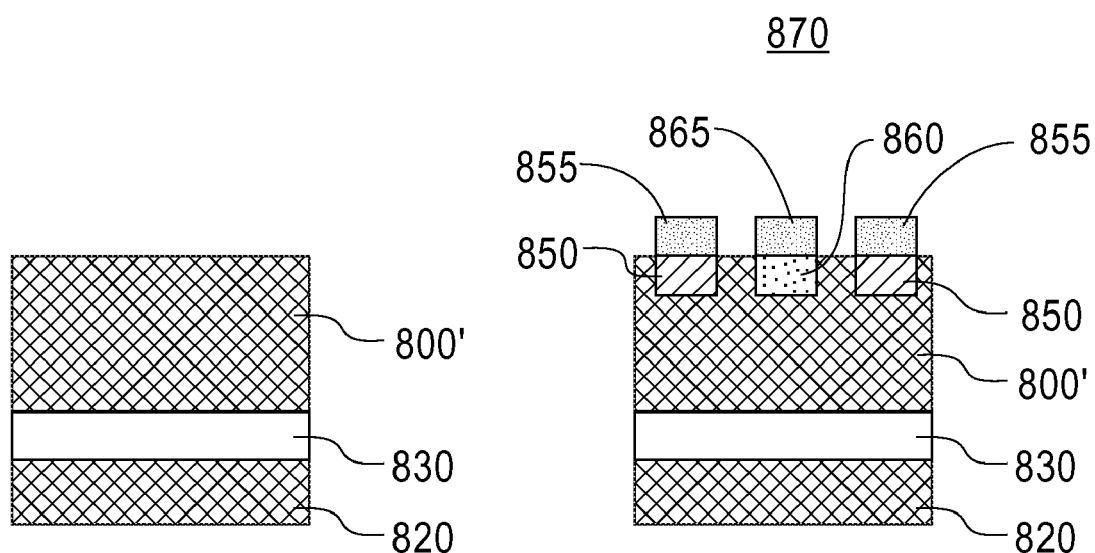
FIG. 9B
FIG. 9C

THICK EPITAXIAL SILICON BY GRAIN REORIENTATION ANNEALING AND APPLICATIONS THEREOF

FIELD OF THE INVENTION

The invention generally relates to grain growth, grain boundary passivation, and grain boundary elimination in thick silicon (Si), particularly polycrystalline silicon (poly-Si), films for applications in which thick (e.g., 1 μm to 40 μm) single crystal or multicrystal silicon films are preferred over polycrystalline films of the same thickness. More particularly, this invention relates to a method of grain growth and reorientation that can convert thick poly-Si films into a single crystal material having the orientation of an underlying single crystal Si seed layer.

BACKGROUND OF THE INVENTION

Demand for high efficiency, low cost solar cells has led to strong interest in cost-effective process technologies for forming thick (1 μm to 40 μm) layers of single crystal silicon. High temperature chemical vapor deposition (CVD) processes (on the order of 750° C.-950° C. or greater) can deposit epitaxial Si at a rate of 1-3 μm/min. Such high rate epitaxial (HRE) CVD processes can be used in a variety of solar cell fabrication schemes. For example, HRE-CVD Si layers have been deposited on (i) seed layers of super-large-grained (e.g., grain sizes on the order of 10 μm to 50 μm or greater) polycrystalline Si (poly-Si) and (ii) seed layers produced from and/or formed on porous Si, as has been described by K. Snoeckx et al. in "The potential of thin-film crystalline solar cells," http://www.semiconductor.net/article/CA6445466.html, and G. Beaucarne and J. Poortmans in "Crystalline Si solar cells," http://www.imec.be/wwwinter/mediacenter/en/SR2003/scientific_results/research_imec/2_4_pho to/2_4_2/2_4_2_1_cont.html?reload_coolmenus.

There is also a potential need for thick layers (on the order of 1 μm to 40 μm) of single crystal silicon on insulator (thick SOI) for high power device applications. Epitaxial growth of thick Si layers on conventional thin (150 nm to 200 nm) SOI by CVD is expected to be slow and expensive, and requires special cleaning of the initial thin SOI growth surface to ensure good epitaxy. However, the alternatives are unattractive: donor wafer bonding to a handle wafer followed by donor wafer etchback sacrifices the entire donor wafer, and the hydrogen ion implantation processes typically used for SmartCut™-type splittings are typically restricted to relatively shallow depths (e.g., a few hundred nm at most).

There is also interest in cost-effective methods for forming large-grained poly-Si films that may be used in place of currently used metal-induced crystallization (MIC) methods. While MIC methods can result in large Si grains, the intra-grain defect density is high and the resulting poly-Si typically has high levels of metallic contamination. Even when metallic contamination is not present, inadequately passivated grain boundaries can reduce minority carrier lifetimes. While annealing in the presence of hydrogen molecules, radicals, and ions is often suggested as a method of passivating grain boundaries, the benefits provided by such passivation are often transient, as the hydrogen passivation is not stable to the thermal stresses of processing.

It would therefore be desirable to have alternative methods of forming thick layers of high quality single crystal Si, multicrystal Si, and large-grained well-passivated poly-Si that do not have the aforementioned limitations and disadvantages.

SUMMARY OF THE INVENTION

The present invention exploits a recent observation that poly-Si grains on a single crystal Si substrate layer are unstable at high temperatures and will gradually rearrange themselves to form a single crystal material with the orientation of the single crystal substrate layer. For example, it was found that 110-oriented Si grains embedded in a 100 Si wafer can convert to a 100 orientation, as an undesirable effect to be avoided when fabricating hybrid orientation substrates [K. L. Saenger et al., Mat. Res. Soc. Symp. Proc. 913 D1.1 (2006)]. In addition, the conversion of poly-Si to single crystal Si was observed to occur in samples prepared for studies of interfacial oxide dissolution between a bulk Si wafer and a differently oriented single crystal or polycrystalline Si overlayer [K. L. Saenger et al., J. Electrochemical Soc., 155 H80 (2008)].

The present invention teaches the use of this effect and the annealing conditions required to reorient the grains of a thick poly-Si layer disposed on a Si seed layer which may be a conventional thin SOI layer, a thin single crystal Si layer on a porous Si release layer, or a multicrystal Si substrate. This approach thus allows the production of Si films having the quality of single crystal silicon at the high rates and low cost of processes developed for poly-Si (or amorphous Si) deposition. For example, the poly-Si deposition and annealing steps of the inventive method are easily performed with batch (as opposed to single wafer) tooling. Another advantage of the instant invention is that the reorientation method of forming thick single crystal Si does not require an oxide-free seed layer surface, since thin interfacial oxides readily dissolve at the annealing temperatures used.

It is further noted that the thick poly-Si (or amorphous Si) layer having a thickness from 1 μm to 40 μm may be intrinsic (without any deliberate doping) or doped in-situ (during deposition) or ex-situ (after deposition). The doping may include p-type dopant atoms, n-type dopant atoms or a combination of p-type and n-type dopant atoms. The concentration of the dopant species may vary depending on the intended use of the thick single crystal layer produced from the inventive method.

Another aspect of this invention pertains to the use of similar high temperature anneals (e.g., 1150° C. or greater) for poly-Si grain growth and grain boundary passivation. While exact mechanisms of grain boundary passivation are incompletely understood, it is generally accepted that the passivation of Si surfaces is accomplished by the elimination of dangling bonds and trapped surface charges. The annealing used in this aspect of the invention is typically performed for 1 hour to 100 hours at a temperature in the range of 1150° C. to 1350° C., preferably 1250° C. to 1330° C., in an ambient of Ar, Ar/O$_2$, or Ar/O$_2$/HCl, where the HCl may come from (e.g., derived from) a variety of Cl-containing precursors (e.g., 1-1-1 trichloroethane, also known as TCA). In the ambients mentioned above, the O$_2$ content is typically from 1 volume percent to 5 volume percent and the HCl content is from 0.01 volume percent to 0.1 volume percent.

Other inert gases such as, for example, helium, krypton, neon and combinations thereof may be substituted for Ar or used in conjunction with Ar, and other oxygen-containing gases such as, for example, ozone, air, and NO may be substituted for oxygen or in conjunction with oxygen. The annealing is preferably performed with a dielectric cap layer, such as a layer of $SiO_2$ having a thickness from 50 nm to 250 nm, to reduce surface oxidation and the associated silicon consumption.

Compared to conventional Al-induced (or, more generally, metal-induced) crystallization methods, the present method for poly-Si grain growth is expected to produce smaller grains, e.g., grains having a size as small as several (1-5) μm or less. However, a lower intragrain defectivity is expected, and the resulting material may be intrinsic, n, or p doped (in contrast to Si formed by Al-induced crystallization, which is always p-type).

Yet another aspect of the invention pertains to solar cell process flows and designs that are compatible with these high temperature annealing processes. In particular, several integration schemes are provided herein wherein doped layers and/or regions are formed after the high temperature annealing steps rather than before, to avoid unwanted dopant diffusion and preserve the desired doping profiles.

BRIEF DESCRIPTION OF THE DRAWINGS

FIGS. 2A-2B show cross section scanning electron microscope images of a double poly-Si layer on a SOI seed substrate before (A) and after (B) a grain reorientation anneal in accordance with the invention.

FIGS. 3A-3B show cross section scanning electron microscope images of a double poly-Si layer on an oxide layer before (A) and after (B) the same grain reorientation anneal used for the samples of FIGS. 2A and 2B.

FIGS. 4A-4F show, in cross section schematic view, the first of several possible approaches for integrating the inventive GRA process with conventional solar cell processing, specifically, an approach in which a poly-Si/seed layer couple is detached from a donor wafer before the GRA, and interdigitated junctions of n-type and p-type doping and their associated contacts are disposed on the solar cell front surface.

FIGS. 7A-7D show, in cross section schematic view, one approach for integrating the inventive GRA process with solar cell fabrication on a multicrystalline seed layer substrate.

FIGS. 8A-8D show, in cross section schematic view, one approach for integrating a poly-Si grain growth anneal in accordance with the present invention with solar cell fabrication, specifically, an approach in which the poly-Si layer is doped prior to grain growth annealing.

FIGS. 9A-9C show, in cross section schematic view, another approach for integrating a poly-Si grain growth anneal of the present invention with solar cell fabrication, specifically, an approach in which the poly-Si layer is subjected to grain growth and passivation annealing prior to formation of interdigitated junctions of n-type and p-type doping and their associated contacts on the solar cell front surface.

DETAILED DESCRIPTION OF THE INVENTION

The present invention, which generally provides a method of converting thick, non-single crystal Si layers into single crystal Si layers, a method for Si grain growth and grain boundary passivation, and means for integrating the same into a solar cell fabrication scheme, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, and in one aspect of the invention, a method for forming a thick (on the order of from 1 μm to 40 μm) single crystal Si layer on a single crystal Si seed layer is provided. This aspect of the present invention includes first selecting a substrate having a Si seed layer located thereon. Next, a thick layer (on the order of 1 μm to 40 μm) of amorphous, multicrystalline or polycrystalline Si is formed on a surface of the Si seed layer to form a seed layer/Si layer couple. The term "seed layer/Si layer couple" is used throughout the instant application to denote the bilayer structure comprising a Si layer in contact with a Si seed layer. After forming the seed layer/Si layer couple, an annealing step is performed in an ambient and for a time and temperature sufficient to induce a desired amount of grain reorientation and epitaxy with the seed layer.

Figures 1A, 1B, 1C:
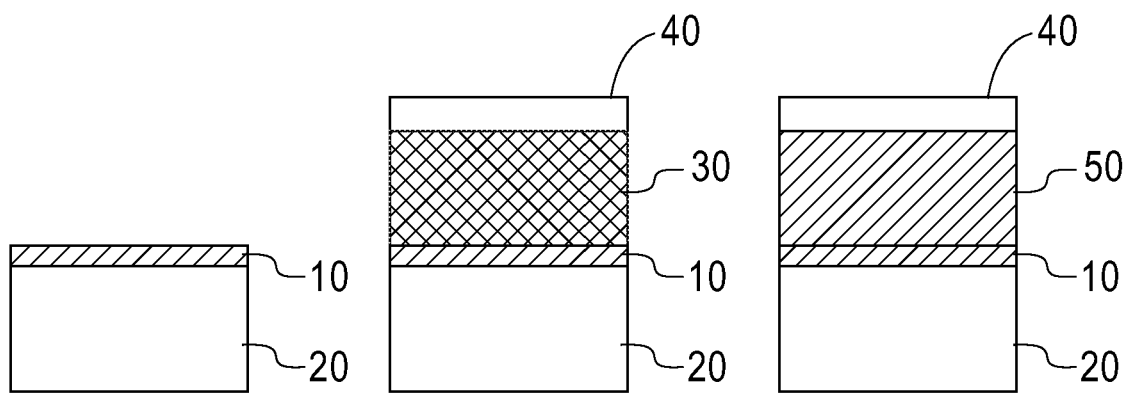
FIGS. 1A-1C show, in cross section schematic view, the steps of the present inventive grain reorientation annealing (GRA) method for converting a thick poly-Si layer to a single crystal Si layer.

Reference is now made to FIGS. 1A-1C which show, in cross section schematic view, the inventive grain reorientation annealing (GRA) method for converting a thick poly-Si layer to a single crystal Si layer. In the embodiment illustrated, a poly-Si layer is described and illustrated. Although such description is provided and illustrated, the inventive method works when amorphous Si or multicrystalline Si is used in place of the poly-Si layer.

Specifically, FIG. 1A shows Si seed layer 10 disposed on a substrate 20. The Si seed layer 10 of the present invention is a single crystal or multicrystalline Si seed layer which is formed by a conventional deposition process including, but not limited to, epitaxial growth. The Si seed layer 10 of the present invention typically has a thickness that is less than 1 µm, with a thickness from 50 nm to 150 nm being more typical. The Si seed layer 10 may include a single crystal Si layer, a silicon-on-insulator layer, or a multicrystalline Si layer. It is noted that multicrystalline Si layers are not polycrystalline materials, but instead are materials that have varying grain sizes that can be as large as several mm.

The substrate 20 includes a bulk thermally stable insulator substrate such as $SiO_2$ or sapphire; an insulator-on-silicon substrate, or a silicon-on-porous silicon release layer substrate. For the case in which substrate 20 is an insulator-on-silicon substrate, the method of FIGS. 1A-1C would produce a thick (e.g., 200 nm to 50 µm) SOI substrate from a thin (e.g., 50 nm-200 nm) SOI substrate. Porous substrates are made utilizing processes such as electrolytic anodization that are well known to those skilled in the art. The substrate 20 is typically thermally stable, meaning that it will not degrade or decompose under the annealing conditions employed in the present invention.

Next, and as shown in FIG. 1B, a thick poly-Si layer 30 and an optional protective cap layer 40 are formed on the Si seed layer 10 shown in FIG. 1A. The thick poly-Si layer 30 has a thickness that is greater than the thickness of the Si seed layer 10. Specifically, the thick poly-Si layer 30 employed in the present invention has a thickness from 1 µm to 40 µm, with a thickness from 10 µm to 25 µm being more preferred. In some embodiments of the invention, a thick amorphous Si layer or multicrystalline Si layer is used in place of the thick poly-Si layer. The thick Si layers can be formed utilizing a conventional deposition process including, but not limited to, low pressure chemical vapor deposition (LPCVD), atmospheric pressure iodine vapor transport (APIVT), atmospheric pressure chemical vapor deposition (APCVD), plasma spray deposition, rapid thermal chemical vapor deposition (RTCVD), ultrahigh vacuum chemical vapor deposition (UHVCVD), chemical solution deposition methods (including sol gel deposition and deposition of nanoparticles from solution), and electrodeposition methods such as plating.

The optional protective cap 40 can be formed utilizing a conventional deposition process including, for example, chemical vapor deposition, plasma enhanced chemical vapor deposition, atomic layer deposition, chemical solution deposition, and evaporation. Alternatively, the protective cap 40 may be formed by a thermal growing process such as thermal oxidation. The protective cap 40 may comprise an oxide, a nitride and/or an oxynitride. In one preferred embodiment of the invention, the protective cap 40 is an oxide, such as $SiO_2$. The thickness of the protective cap 40 may vary depending on the material of the protective cap as well as the process used in forming the same. Typically, the protective cap 40 has a thickness from 50 nm to 250 nm, with a thickness from 100 nm to 150 nm being even more typical.

The thick (poly, amorphous or multicrystalline) Si layer 30 may be intrinsic (without any deliberate doping) or doped in-situ (during deposition) or ex-situ (after deposition). When an ex-situ doping is used, one of ion implantation, gas phase doping, and dopant diffusion may be employed. The dopant species may be an n-type dopant, a p-type dopant or combinations of re-type and p-type dopants.

After providing the structure shown in FIG. 1B, that structure is then subjected to a grain reorientation anneal (GRA) that converts thick poly-Si layer 30 into thick single crystal 50, as shown in FIG. 1C. The thick single crystal 50 formed utilizing the GRA process has a thickness that is typically equal to, or greater than that of the poly-Si layer 30. The GRA process is performed at conditions (ambient, temperature and time) sufficient to induce a desired amount of grain reorientation and epitaxy with the Si seed layer 10. Ordinarily it would be preferred that the poly-Si layer 30 be annealed until grain reorientation is complete; however, partial or incomplete grain reorientation may be a satisfactory outcome if one prefers less aggressive (e.g., lower temperature or shorter duration) annealing.

The optimum conditions for grain reorientation annealing will depend on the initial poly-Si thickness and grain size. Temperatures of 1150° C. or greater, preferably from 1150° C. to 1350° C., more preferably from 1250° C. to 1330° C., are employed in the present invention. The annealing is typically performed for 1 hour to 100 hours, with a duration from 1 hours to 10 hours being more preferred. The annealing is typically performed in ambient that comprises Ar, $Ar/O_2$, or $Ar/O_2/HCl$, where the HCl is derived from a Cl-containing precursor. In such ambients, the $O_2$ is present in an amount from 1 volume percent to 5 volume percent and the HCl is present in an amount from 0.01 volume percent to 0.1 volume percent.

One example of a Cl-containing precursor is 1-1-1 trichloroethane. Other chlorohydrocabons can also be used as the Cl-containing precursor.

Other inert gases such as, for example, helium, krypton, neon and combinations thereof may be substituted for Ar or used in conjunction with Ar, and other oxygen-containing gases such as, for example, ozone, air, and NO may be substituted for oxygen or used in conjunction with oxygen. Gases such as nitrogen may be substituted for Ar but are less preferable because they may react with silicon to form silicon nitrides.

In one example of the present invention, the GRA process was investigated for poly-Si layers 1000 nm in thickness by deposited by low pressure CVD (LPCVD) in two sequential 500 nm depositions with an air break in-between. The poly-Si was deposited on (i) SOI substrates comprising a 160 nm SOI layer on a 150 nm buried oxide layer and (ii) thermally oxidized Si (oxide thickness 200 nm). A protective cap of low-temperature oxide (LTO) 200 nm in thickness was deposited on both samples prior to any GRA.

FIGS. 2A-2B and 3A-3B show scanning electron microscopy (SEM) images of these samples before (A) and after (B) a 1300° C./1 hr GRA in Ar. Before SEM, the samples were treated with dilute HF to remove surface oxide, coated with Cr, cleaved, and then Secco-etched to highlight grain boundaries and defects. FIG. 2A shows first (lower) and second (upper) poly-Si layers 100 and 110, separated by interface 115, disposed on SOI substrate 120 comprising base substrate 130, buried oxide (box) layer 140, and SOI layer 150. First (lower) poly-Si layer 100 is separated from SOI layer 150 by interface 160. FIG. 3A shows first and second poly-Si layers 200 and 210, separated by interface 215, disposed on thermally oxidized substrate 220 comprising base substrate 230 and thermal oxide layer 240. After the GRA, the images of FIGS. 2B and 3B show no sign of original poly-Si/poly-Si interfaces 115 and 215, indicating complete dissolution of the 1-2 nm of interfacial oxide expected at these interfaces. Merged poly-Si layers 200 and 210, indicated as 260 in FIG. 3B, also show a dramatic increase in Si grain size. However, the material clearly remains polycrystalline, a fact also confirmed by x-ray diffraction (XRD) analysis. In contrast, the SEM image of FIG. 2B shows that poly-Si layers 100 and 110 in the SOT sample have converted into single-grained Si layer

180, though with a fairly high density of stacking faults 190. Further XRD and SEM analysis of these and thinner (500 nm) samples given the 1300° C./1 hr anneal suggests that the GRA process is typically 100% complete for poly-Si films 500 nm in thickness, but only 70-80% complete in the poly-Si films 1000 nm in thickness. From this it is deduced that thicker films take longer to reorient and that the reorientation rate at 1300° C. is about 700-800 nm/hour. Ordinarily it would be preferred that the poly-Si layers be annealed until grain reorientation is complete; however, partial or incomplete grain reorientation may be a satisfactory outcome if one prefers less aggressive (e.g., lower temperature or shorter duration) annealing.

While these examples utilized poly-Si deposited by LPCVD, there are many other satisfactory methods of poly-Si deposition. For example, APIVT (atmospheric pressure iodine vapor transport) has been reported to deposit large-grained (5-20 µm) poly-Si films at a rate of about 1-3 µm/min [see, for example, T. H. Wang et al., "APIVT-grown silicon thin layers and PV devices," http://www.nrel.gov/docs/fy02osti/31441.pdf]. More generally, this invention also includes the possibility of performing grain reorientation annealing on poly-Si initially deposited as amorphous silicon or amorphous hydrogenated silicon, with the conversion to poly-Si occurring at early stages of the grain reorientation annealing.

Because of its functional similarities to high rate epitaxial (HRE)-CVD, it is expected that the poly-Si GRA process of this invention can be used in place of HRE-CVD in most (if not all) of the many integration schemes that have been or will be developed for HRE-CVD, several of which are described by K. Snoeckx et al. and G. Beaucarne and J. Poortmans, cited above.

A second aspect of this invention pertains to the use of similar high temperature anneals (i.e., 1150° C. or greater) for poly-Si grain growth and grain boundary passivation. The annealing used in this aspect of the present invention is typically performed utilizing the same conditions (e.g., temperature, time and ambient) as defined above. This annealing is preferably performed with a protective cap layer, such as a layer of $SiO_2$ 50 to 250 nm in thickness, to reduce surface oxidation and the associated silicon consumption. As in the case of poly-Si layers undergoing GRA, the poly-Si layers undergoing grain growth and grain boundary passivation may be intrinsic (without any deliberate doping) or doped in-situ (during deposition) or ex-situ (after deposition).

In addition to using poly-Si, amorphous Si and multicrystalline Si can also be used in this aspect of the present invention as well.

FIGS. 4A-4F, 5A-5I, and 6A-6G show three possible approaches, in schematic cross section view, for integrating grain reorientation annealing with conventional solar cell processing. Specifically, FIGS. 4A-4F show an approach in which a single crystal Si seed layer is formed on a porous Si release layer, and the poly-Si/seed layer couple is detached from the donor wafer before the GRA to avoid potential problems with release layer degradation resulting from GRA-induced closing of the pores. More specifically, FIG. 4A shows a substrate comprising base substrate 310, porous Si release layer 320, and single crystal seed layer 330. FIG. 4B shows the structure of FIG. 4A after deposition of poly-Si layer 340 on seed layer 330. The structure of FIG. 4B is then bonded to a final substrate 350, as shown in FIG. 4C. Seed layer 330 is then detached from base substrate 310 by breaking porous Si release layer 320, as shown in FIG. 4D. The porous Si release layer 320 is formed utilizing processes well known to those skilled in the art After GRA to convert poly-Si layer 340 into single crystal Si layer 340' (FIG. 4E), interdigitated junctions of n-type (360) and p-type (370) doping and their associated conductive contacts (365 and 375) are formed on exposed front surface 380 to produce solar cell 390 (FIG. 4F).

Figures 5A, 5B, 5C:
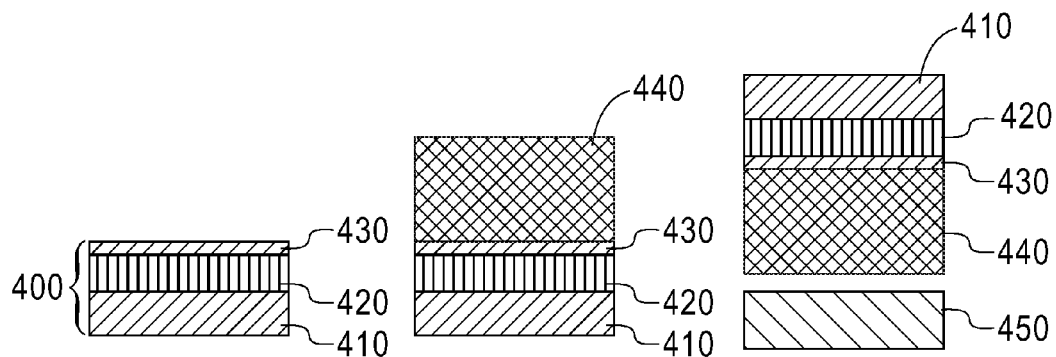
FIGS. 5A-5I show, in cross section schematic view, the second of several possible approaches for integrating the inventive GRA process with conventional solar cell processing, specifically, an approach in which a poly-Si/seed layer couple is detached from a donor wafer and bonded to a carrier substrate before the GRA, and junctions of opposite doping types and their associated contacts are disposed, respectively, on solar cell front and back surfaces.
Figures 5D, 5E, 5F:
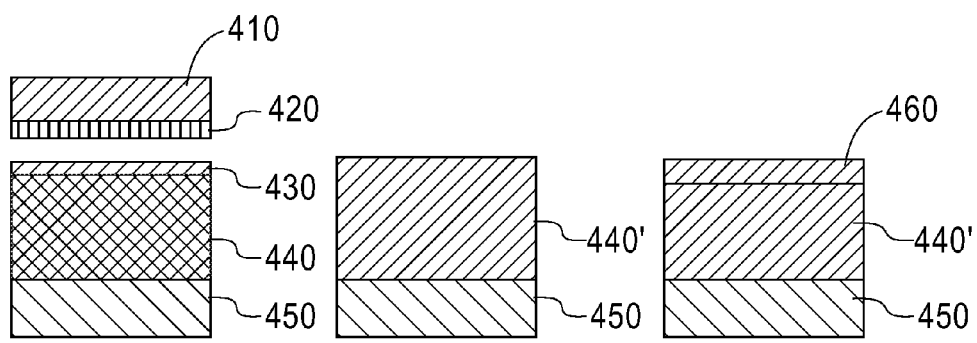
Figures 5G, 5H, 5I:
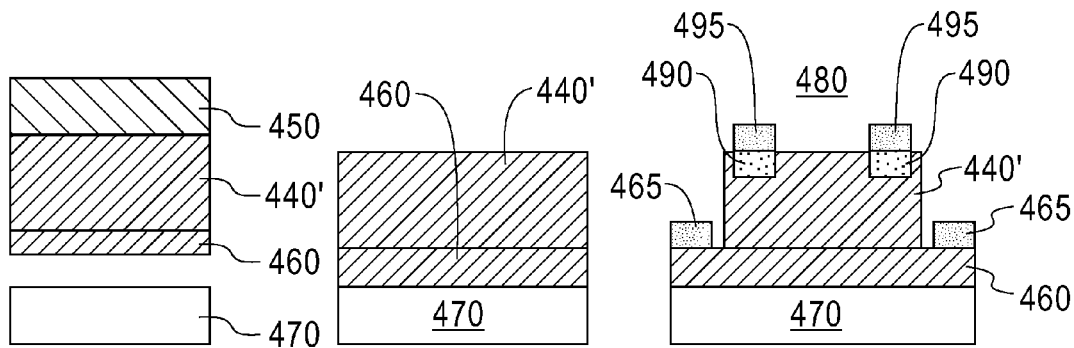

FIGS. 5A-5I show an approach that is similar to that of FIGS. 4A-4F in that a poly-Si/seed layer couple is detached from a donor wafer and bonded to a carrier substrate before the GRA, but different in that junctions of opposite doping types and their associated contacts are disposed, respectively, on solar cell front and back surfaces. FIG. 5A shows substrate 400 comprising base substrate 410, porous Si release layer 420, and single crystal seed layer 430. FIG. 5B shows the structure of FIG. 5A after deposition of poly-Si layer 440 on seed layer 430. The structure of FIG. 5B is then bonded to a temporary handle substrate 450, as shown in FIG. 5C utilizing bonding techniques that are well known to those skilled in the art. Seed layer 430 is then detached from base substrate 410 by breaking porous Si release layer 420, as shown in FIG. 5D. After GRA to convert the poly-Si layer 440 into single crystal Si layer 440' (FIG. 5E), doped layer 460 of a first doping type is formed on single crystal Si layer 440', as shown in FIG. 5F. The doped layer can be formed utilizing a deposition process that may include in-situ doping during layer deposition or ex-situ doping after layer deposition, or the doped layer can be formed by doping an existing upper region of single crystal Si layer 440'. Doped layer 460 is then bonded to final substrate 470 (FIG. 5G) utilizing conventional bonding processes well known to those skilled in the art, followed by removal of temporary handle substrate 450 to form the structure of FIG. 5H. The removal of the temporary handle substrate is performed utilizing a conventional removal process well known to those skilled in the art. Solar cell 480 of FIG. 5I is then formed by contacting doped layer 460 with conductive contacts 465 adding junctions 490 of a second doping type and associated conductive contacts 495 to the solar cell's front surface. Like the process flow of the previous embodiment, the process flow of FIGS. 5A-5I avoids the problem of pores closing during high-T anneal. However, this process flow has the added advantage of allowing the insertion of doped layers (shown) or additional other layers (not shown) at the interface between single crystal Si layer 440' and final substrate.

Figures 6A, 6B, 6C:
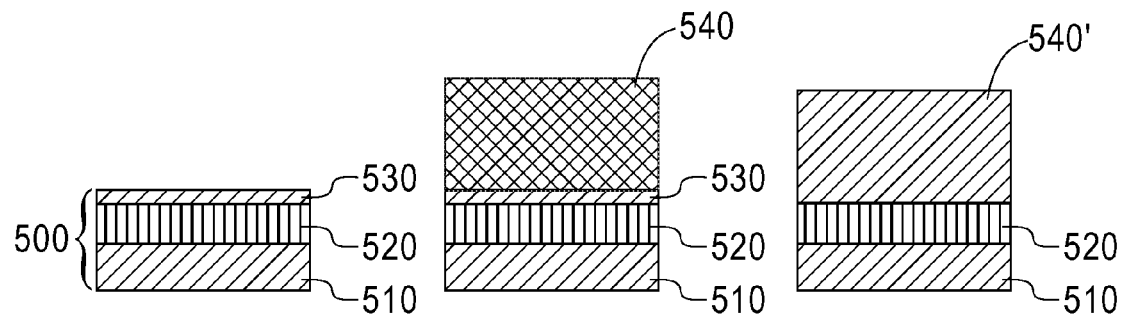
FIGS. 6A-6G show, in cross section schematic view, the third of several possible approaches for integrating the inventive GRA process with conventional solar cell processing, specifically, an approach in which a poly-Si/seed layer couple is detached from a donor wafer and bonded to a carrier substrate after the GRA, and junctions of opposite doping types and their associated contacts are disposed, respectively, on solar cell front and back surfaces.
Figures 6D, 6E:
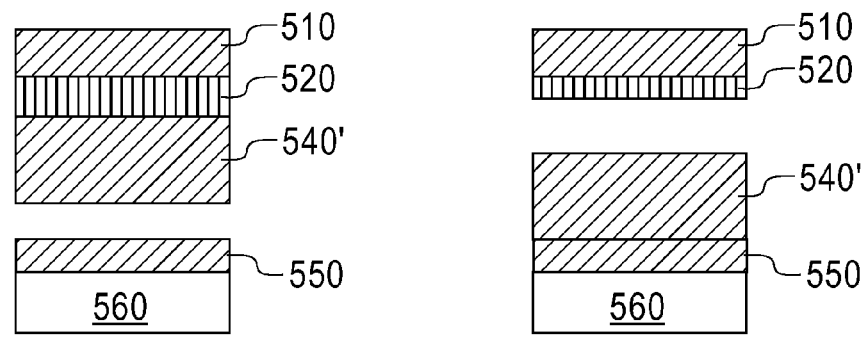
Figures 6F, 6G:
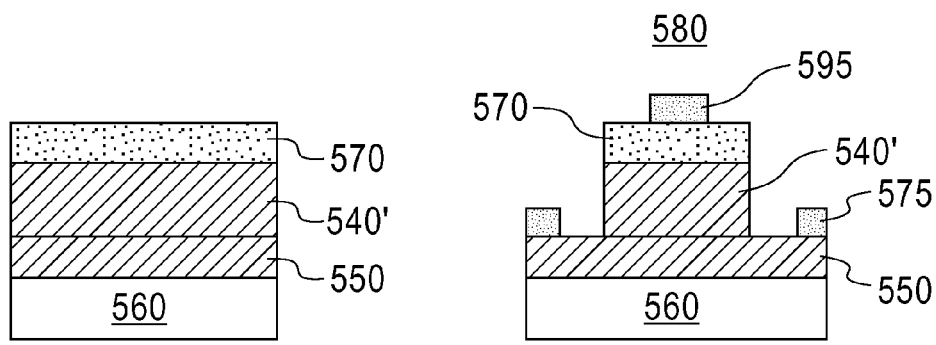

It should be noted that GRA annealing may be performed before or after removal of the poly-Si/Si seed layer couple from its supporting substrate. FIGS. 6A-6G show an approach in which a poly-Si/seed layer couple is detached from a donor wafer and bonded to a carrier substrate after the GRA. FIG. 6A shows substrate 500 comprising base substrate 510, porous Si release layer 520, and single crystal seed layer 530. FIG. 6B shows the structure of FIG. 6A after deposition of poly-Si layer 540 on seed layer 530. The structure of FIG. 6B is then subjected to GRA to convert poly-Si layer 540 into single crystal Si layer 540' to produce the structure of FIG. 6C. Note in FIG. 6C that single crystal seed layer 530 is not shown for sake of clarity. As shown in FIG. 6D, doped layer 550 of a first doping type is formed on a final handle substrate 560 and bonded to single crystal Si layer 540'. (Alternatively, doped layer 550 could have been formed on single crystal layer 540' and bonded to final handle substrate 560.) Single crystal layer 540' is then detached from base substrate 510 by breaking porous Si release layer 520, as shown in FIG. 6E. Doped layer 570 of a second doping type opposite to the first doping type is then formed on single crystal Si layer 540', as shown in FIG. 6F. Solar cell 580 of FIG. 6G is then formed by contacting doped layer 550 with conductive contacts 575 and contacting doped layer 570 with conductive contacts 595 to the solar cell's front surface. While the approach of FIGS. 6A-6G makes it much easier to form doped and/or other layers on surfaces that will eventually be bonded, it makes the detachment process more difficult, as the pores may close during high-T anneal.

FIGS. 7A-7D show, in cross section schematic view, one approach for integrating GRA with solar cell fabrication on a multicrystalline seed layer substrate. FIG. 7A shows multicrystalline Si substrate 600, and FIG. 7B shows multicrystalline seed layer substrate 600 after deposition of poly-Si layer 640. After GRA to convert poly-Si layer 640 into single crystal Si layer 640' (FIG. 7C), interdigitated junctions of a first doping type (660) and an opposite doping type (670) and their associated conductive contacts (665 and 675) are formed on exposed front surface 680 to produce solar cell 690 (FIG. 7D). An advantage of this approach is that the purity of deposited poly-Si can be greater than that of the multicrystalline seed layer substrate.

FIGS. 8A-8D and 9A-9C show, in cross section schematic views, two approaches for integrating a high temperature (>1200° C.) poly-Si grain growth anneal with solar cell fabrication. There is no Si seed layer in either approach. In the approach of FIGS. 8A-8D, a layer of fine-grained polycrystalline or amorphous Si layer 700 is deposited on a thermally stable substrate 710 comprising, for example, base substrate 720 and buffer layer 730, as shown in FIG. 8A. Si layer 700 is shown here as being doped with a first doping type; it may be doped in-situ during growth, doped after deposition, or doped after the high temperature annealing that is done to form large-grained polycrystalline layer 700' of FIG. 8B. The large-grained grain structure of layer 700' can then act as a template for subsequently formed layers which would typically include intrinsic Si (or Si-containing) layer 740 and an oppositely doped layer 750, as shown in FIG. 8C. Solar cell 760 of FIG. 8D is then formed by forming conductive contacts 775 on doped layer 700' and conductive contacts 785 on oppositely doped layer 750 on the solar cell's front surface.

In the approach of FIGS. 9A-9C, a thick poly-Si layer is annealed for grain growth and passivation prior to formation of top interdigitated contacts. FIG. 9A shows thick poly-Si layer 800 disposed on thermally stable substrate 810 comprising, for example, base substrate 820 and buffer layer 830. Thick poly-Si layer 800 would typically be intrinsic (i.e., undoped). FIG. 9B shows the structure of FIG. 9A after a grain growth/passivation anneal produces passivated poly-Si layer 800'. Interdigitated junctions of n-type (850) and p-type (860) doping and their associated conductive contacts (855 and 865) are formed on exposed front surface of passivated poly-Si layer 800' to produce solar cell 870 (FIG. 9C).

Another aspect of this invention includes structures comprising either (i) thick single crystal Si layers formed by the GRA process of this invention or (ii) polycrystalline Si layers subjected to the grain growth and grain boundary passivation anneals of this invention.

While several embodiments of the invention, together with modifications thereof, have been described in detail herein and illustrated in the accompanying drawings, it will be evident that various further modifications are possible without departing from the scope of the invention. Nothing in the above specification is intended to limit the invention more narrowly than the appended claims. The examples given are intended only to be illustrative rather than exclusive.

What is claimed is:

1. A method for forming a thick single crystal Si layer on a Si seed layer in a solar cell comprising:
    selecting a substrate having a Si seed layer located thereon;
    depositing a thick layer of Si on said Si seed layer to form a seed layer/Si layer couple, said thick layer of Si being a non-single crystal Si material; and
    annealing said seed layer/Si layer couple at a temperature of about 1150° C. or greater and in an ambient sufficient to induce a desired amount of grain reorientation and epitaxy with said Si seed layer, wherein the annealing converts the thick layer of Si to a single crystal Si layer having a same crystal orientation as the Si seed layer.

2. The method of claim 1 wherein said thick layer of Si is doped prior to said annealing.

3. The method of claim 1 wherein said thick layer of Si comprises a poly-Si layer, an amorphous Si layer, or a multicrystalline Si layer.

4. The method of claim 1 further comprising forming a dielectric cap layer on a surface of said thick layer of Si prior to said annealing.

5. The method of claim 1 wherein said temperature is between 1150° C. and 1350° C.

6. The method of claim 1 wherein said ambient comprises Ar, Ar/$O_2$, or Ar/$O_2$/HCl, where the HCl is derived from a Cl-containing precursor, said $O_2$ is present in an amount from 1 volume percent to 5 volume percent and said HCl is present in an amount from 0.01 volume percent to 0.1 volume percent.

7. The method of claim 1 wherein said Si seed layer is a single crystal Si layer on a porous Si release layer, wherein said Si seed layer/thick Si layer couple is detached from said substrate prior to said annealing, or is detached from said substrate after said annealing.

8. The method of claim 1 wherein said Si seed layer is a silicon-on-insulator layer.

9. The method of claim 1 wherein said Si seed layer is a multicrystalline Si substrate and said thick layer of Si is a thick multicrystalline Si layer.

10. The method of claim 1 wherein said thick layer of Si is thicker than said Si seed layer.

11. A method for forming a large-grained, well-passivated Si layer in a solar cell comprising:
    selecting a thermally stable substrate;
    depositing a layer of Si on said substrate, said layer of Si being a non-single crystal Si material; and
    annealing said Si layer at a temperature of about 1150° C. or greater and in an ambient sufficient to induce a desired amount of grain growth and to eliminate dangling bonds and trapped surface charges in the Si layer.

12. The method of claim 11 wherein said layer of Si comprises a layer of poly-Si, a layer of amorphous Si, or a layer of multicrystalline Si.

13. The method of claim 11 wherein said layer of Si is doped prior to said annealing.

14. The method of claim 11 further comprising forming a dielectric cap layer on the surface of said layer of Si prior to said annealing, wherein said dielectric cap layer comprises $SiO_2$ having a thickness between 50 nm and 250 nm.

15. The method of claim 11 wherein said temperature is between 1250° C. and 1330° C.

16. The method of claim 11 wherein said ambient comprises Ar, Ar/$O_2$, or Ar/$O_2$/HCl, where the HCl is derived from a Cl-containing precursor, said $O_2$ is present in an amount from 1 volume percent to 5 volume percent and said HCl is present in an amount from 0.01 volume percent to 0.1 volume percent.

17. The method of claim 6 wherein said Cl-containing precursor is 1-1-1 trichloroethane.

18. The method of claim 16 wherein said Cl-containing precursor is 1-1-1 trichloroethane.

19. A method for forming a single crystal Si layer on a Si seed layer of a solar cell comprising:
   selecting a substrate having a Si seed layer located thereon;
   depositing a layer of Si on said Si seed layer to form a seed layer/Si layer couple, said layer of Si being a non-single crystal Si material; and
   annealing said seed layer/Si layer couple at a temperature of about 1150° C. or greater and in an ambient sufficient to induce a desired amount of grain reorientation and epitaxy with said seed layer, wherein the annealing converts the layer of Si to a single crystal Si layer having a same crystal orientation as the Si seed layer.

20. The method of claim 1 wherein said thick layer of Si is polycrystalline Si.

* * * * *